(12) United States Patent
Kerdiles et al.

(10) Patent No.: US 7,972,939 B2
(45) Date of Patent: *Jul. 5, 2011

(54) TRANSFER METHOD WITH A TREATMENT OF A SURFACE TO BE BONDED

(75) Inventors: Sébastien Kerdiles, Saint-Ismier (FR); Christophe Maleville, La Terrasse (FR); Fabrice Letertre, Grenoble (FR); Olivier Rayssac, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 12/566,036

(22) Filed: Sep. 24, 2009

(65) Prior Publication Data

US 2010/0015780 A1 Jan. 21, 2010

Related U.S. Application Data

(60) Division of application No. 11/138,926, filed on May 25, 2005, now Pat. No. 7,615,464, which is a continuation of application No. PCT/IB2004/003275, filed on Sep. 21, 2004.

(51) Int. Cl.
*H01L 21/46* (2006.01)
(52) U.S. Cl. ........... 438/458; 438/455; 257/E21.122; 257/E21.567; 257/E21.568
(58) Field of Classification Search .......... 438/458; 257/E21.122
See application file for complete search history.

(56) References Cited

U.S. PATENT DOCUMENTS

| | | | |
|---|---|---|---|
| 5,395,788 A | 3/1995 | Abe et al. | 438/690 |
| 5,877,070 A * | 3/1999 | Goesele et al. | 438/458 |
| 6,180,496 B1 | 1/2001 | Farrens et al. | 438/455 |

(Continued)

FOREIGN PATENT DOCUMENTS

EP  1 039 513 A2  9/2000

(Continued)

OTHER PUBLICATIONS

Kern, Handbook of Semiconductor Wafer Cleaning Technology; 1993; Noyes Publications; "Aqueous Cleaning Processes"; pp. 111-151.*

(Continued)

*Primary Examiner* — Matthew C Landau
*Assistant Examiner* — Vicki B Booker
(74) *Attorney, Agent, or Firm* — Winston & Strawn LLP

(57) ABSTRACT

A method for minimizing or avoiding contamination of a receiving handle wafer during transfer of a thin layer from a donor wafer. This method includes providing a donor wafer and a receiving handle wafer, each having a first surface prepared for bonding and a second surface, with the donor wafer providing a layer of material to be transferred to the receiving handle wafer. Next, at least one of the first surfaces is treated to provide increased bonding energy when the first surfaces are bonded together; the surfaces are then bonded together to form an intermediate multilayer structure; and a portion of the donor wafer is removed to transfer the thin layer to the receiving handle wafer and form the semiconductor structure. This method avoids or minimizes contamination of the second surface of the receiving handle wafer by treating only the first surface of the donor wafer prior to bonding by exposure to a plasma, and by conducting any thermal treatments after plasma activation at a temperature of 300° C. to 500° C. in order to avoid diffusion of impurities into the transfer layer.

16 Claims, 3 Drawing Sheets

U.S. PATENT DOCUMENTS

Figure 2A:
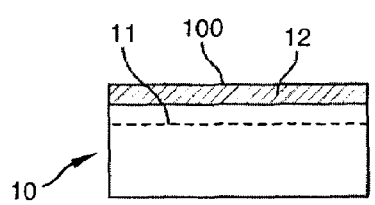
Figure 2A:
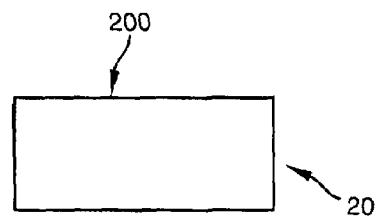

| | | | |
|---|---|---|---|
| 6,368,938 B1 | 4/2002 | Usenko | 438/407 |
| 6,468,923 B1 | 10/2002 | Yonehara et al. | 438/761 |
| 6,548,382 B1 | 4/2003 | Henley et al. | 438/526 |
| 6,605,518 B1 | 8/2003 | Ohmi et al. | 438/458 |
| 6,911,376 B2* | 6/2005 | Yoo | 438/458 |
| 6,995,075 B1 | 2/2006 | Usenko | 438/458 |
| 7,176,108 B2* | 2/2007 | Cayrefourcq et al. | 438/458 |
| 7,176,528 B2* | 2/2007 | Couillard et al. | 257/347 |
| 2003/0227057 A1 | 12/2003 | Lochtefeld et al. | 257/347 |
| 2004/0035525 A1 | 2/2004 | Yokokawa et al. | 156/281 |
| 2004/0097055 A1 | 5/2004 | Henley et al. | 438/471 |

FOREIGN PATENT DOCUMENTS

| | | |
|---|---|---|
| EP | 1 050 901 A2 | 11/2000 |
| EP | 1 381 086 A1 | 1/2004 |
| JP | 11-087668 A | 3/1999 |
| WO | WO 2004/008514 A1 | 1/2004 |
| WO | WO 2004/042779 A2 | 5/2004 |

OTHER PUBLICATIONS

Burkman et al., "Aqueous Cleaning Processes," Handbook of Semiconductor Wafer Cleaning Technology: Science, Technology, and Applications, Edited by W. Kern, Noyes Publications, pp. 111-151 (2003).

Cai et al., "Single crystal Si layers on glass formed by ion cutting," Journal of Applied Physics, 92(6): 3388-3392 (2002).

Cho et al., "Low temperature Si layer transfer by direct bonding and mechanical ion cut," Applied Physics Letters, 83(18): 3827-3829 (2003).

Colelli et al., "Metal contamination monitoring in ion implantation technology," 8th International Symposium on Plasma- and Process-Induced Damage, IEEE, pp. 81-84, Apr. 24-25, 2003.

Henttinen et al., "Cold ion-cutting of hydrogen implanted Si," Nuclear Instruments and Methods in Physics Research B, 190: 761-766 (2002).

Lu et al., "Ion-cutting of Si onto glass by pulsed and direct-current plasma immersion ion implantation," J. Vac. Sci. Technol. B, 21(5): 2109-2113 (2003).

Suni et al., "Effects of Plasma Activation on Hydrophilic Bonding of Si and $SiO_2$," Electrochemical Society Proceedings vol. 2001-27, pp. 22-31 (2001).

Taraschi et al. "Ultrathin Strained Si-on-Insulator and SiGe-on-Insulator Created using Low Temperature Wafer Bonding and Metastable Stop Layers," Journal of the Electrochemical Society, 151(1): G47-G56 (2004).

Verdonck et al., "Metal contamination of silicon wafers induced by reactive ion etching plasmas and its behavior upon subsequent cleaning procedures," J. Vac. Sci. Technol. B, 14(1): 538-542 (Jan./Feb. 1996).

Wiegand et al., "Time-Dependent Surface Properties and Wafer Bonding of $O_2$-Plasma-Treated Silicon (100) Surfaces," Journal of the Electrochemical Society, 147(7): 2734-2740 (2000).

* cited by examiner

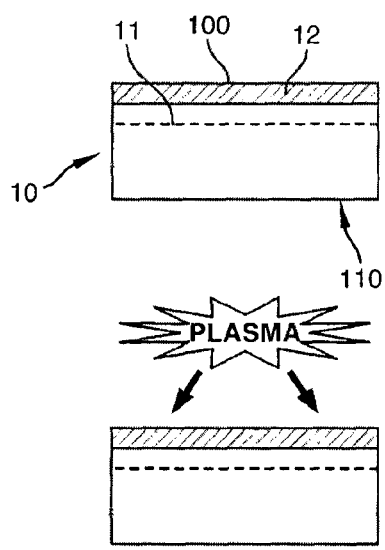
FIG. 1a
PRIOR ART
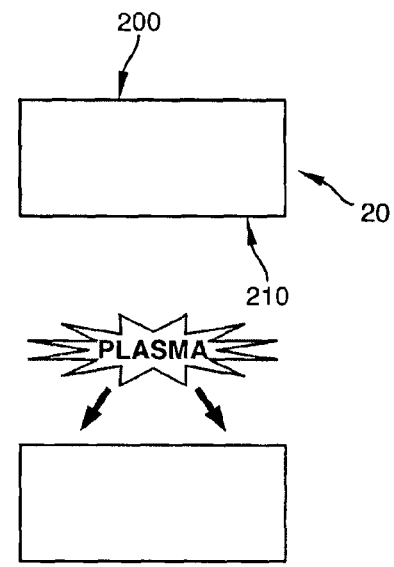
FIG. 1b
PRIOR ART
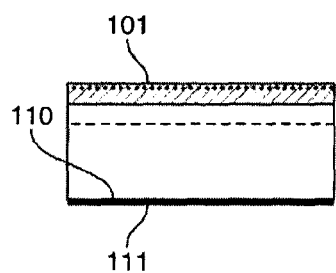
FIG. 1c
PRIOR ART
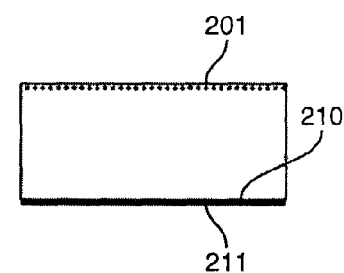
FIG. 1d
PRIOR ART
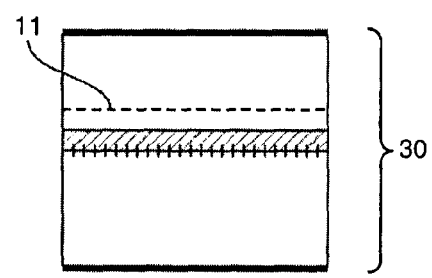
FIG. 1e
PRIOR ART
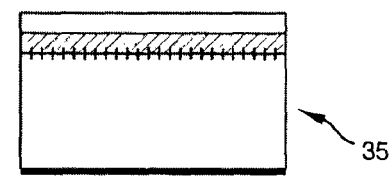

TRANSFER METHOD WITH A TREATMENT OF A SURFACE TO BE BONDED

CROSS-REFERENCE TO RELATED APPLICATIONS

This application is a division of application Ser. No. 11/138,926 filed May 25, 2005, now U.S. Pat. No. 7,615,464 which is a continuation of International application no. PCT/IB2004/003275 filed Sep. 21, 2004. The entire content of each prior application is expressly incorporated herein by reference thereto.

BACKGROUND

The invention generally concerns the manufacturing of multilayer wafer including materials selected from semiconductor materials, and used in applications in microelectronics, optics, optoelectronics and/or optonics.

More precisely, the invention concerns the processes for transferring from a "top" wafer (or donor wafer—these terms being herein understood as equivalent) a layer of a semiconductor material onto a "handle" (or receiving wafer, or "base" wafer—these terms being herein understood as equivalent) in order to make a multilayer wafer.

Several main types of such processes are known. Many of these processes imply a bonding step for bonding the handle and the top wafers, before a removal of the excess material from the bonded top wafer. We will refer to such processes which imply a bonding step as "bond and transfer processes" (or "BTP" processes).

It is specified that the definitions and corresponding acronyms givers in this document are provided for the purpose of clearly defining the invention which is the subject matter to be protected by this document. These definitional acronyms are therefore intended to be used only for the purpose of understanding this particular subject matter. They are not intended to be used for any other purpose, e.g., for the interpretation of other documents such as related patents or patent applications unless otherwise specified.

The known types of BTP processes include:

the BESOI-type process (the removal of material from the top wafer is performed through an etching of the top wafer), the ELTRAN®-type process (the removal is performed through a detachment of the excess material with the detachment resulting from the attack of a porous region of the top wafer), the SMART-CUT®-type process (the removal is performed through a detachment of the excess material with the detachment resulting from the splitting of the top wafer at an embrittlement or weakened region obtained by implantation of the top wafer with at least one species. It is specified that a general description of the main steps of a non-limiting embodiment of this type of method can be found in the text entitled SILICON-ON-INSULATOR TECHNOLOGY: Materials to VLSI, 2nd Edition (Jean-Pierre COLINGE).

The bonding step of such processes is generally performed without adding any adhesives (such as resins) between the top and handle wafers. We will refer to such bonding without adhesive as "direct bonding," And a BTP comprising such a direct bonding will be referred to as "Direct bonding and transfer process" (or "DBTP"). For such direct bonding, the surfaces to be bonded must be very smooth (i.e., present a very low roughness). And it is possible to provide a smooth surface over a first wafer which is to be bonded with a second wafer through a direct bonding, e.g. by building a "bonding layer" (e.g., with an oxide layer) over the first wafer, and/or by submitting the surface of the first wafer to a specific treatment (e.g. polishing, . . . ).

A bonding of the surfaces of two wafers generates between the bonded surfaces a bonding interface associated with a given bonding energy with the higher this energy the stronger the bond. The bonding energy obtained by direct bonding two wafers without any additional treatment is sometimes not sufficiently high. This is the case in particular when it is desired to obtain with the bonding of two or more wafers a multilayer wafer (each initial wafer bringing a "layer" to the multilayer wafer thus obtained), with a high energy bond (i.e., a bonding energy typically greater than 500 mJ/m2) between the bonded wafers. In such cases, the bonded wafers are thus subjected to a "bonding heat treatment" ("BHT") which improves bonding strength. More precisely, the BHT is generally carried out at high temperatures (i.e., at temperatures of 900° C. or higher). A high temperature BHT carried out at a temperature higher than 900° C. will be referred to herein as "HT BHT".

A HT BHT reinforces the bonding interface and can raise its bonding energy to a desired level. As an illustration, the bonding energy between a Si wafer and a Si or SiO2 wafer is maximized after a HT BHT at temperatures on the order of 1100-1200° C. The bonding energy obtained after a HT BHT can e.g. be 2 to 2.5 $J/m^2$ for a bonding of Si/Si, SiO2/SiO2, or Si/SiO2. Such HT BHT can therefore allow the manufacturing of multilayer wafers with adequate bonding energy between the bonded layers of the wafer.

However, it can be undesirable to carry out a HT BHT on a multilayer wafer. This is the case e.g. when the layers of the multilayer wafer have respective coefficients of thermal expansion (CTE) that are significantly different. In such cases, the layers having the different CTEs will undergo expansions of different magnitudes when exposed to a HT BHT. This can lead to negative effects such as a warp of the wafers, or even the generation of defects such as dislocations in the crystalline structure of the wafers.

It can also be undesirable to carry out a HT BHT on a bonded multilayer wafer for other reasons, e.g. the wafer already comprises components totally or partially elaborated (such wafer is usually called "structured substrate"), or the material of the wafer is likely to be altered by a high temperature treatment (e.g. the case of a wafer that has a sharp doping profile with boron or phosphorous, or comprising metastable layers that would be altered by HT BHT, like low k materials, high k materials or layers with metallic elements like $Al_2O_3$, TiN, etc.).

In order to avoid such drawbacks and nevertheless obtain a high bonding energy between bonded layers of a multilayer wafer, techniques of high bonding energy at low temperatures have been developed. In one of these techniques, the surfaces to be bonded are "activated" by their exposure to a plasma, before being contacted together. Such technique will be referred to as "plasma activation" technique. Plasma activation is advantageous since it allows obtaining high bonding energy with a BHT which is carried out after contacting the surfaces to be bonded, but which remains limited to a low temperature BHT ("LT BHT"). And plasma activation has been proposed for DBTPs as a solution for obtaining a high energy bonding without requiring carrying out a HT BHT on a bonded multilayer wafer.

A general illustration of such known DBTP is given in the article entitled "Ultra-thin strained-silicon-on-insulator and SiGe-on-insulator created using low temperature wafer bonding and metastable layers", Taraschi et al., J. Electrochem. Soc. Vol. 151, No. 1, p. 47 (2004). This article discloses a SMART-CUT®-type process in which prior to the wafer bonding step (between a top and a handle wafers) a plasma activation can be carried out on the surfaces to be bonded. The general principle of such process is illustrated in FIG. 1, which comprises FIGS. 1a to 1e to show the successive main steps of such a known principle.

FIG. 1a shows a top wafer 10, and a handle wafer 20. The top wafer 10 has been implanted with one or more species in order to form an embrittlement or weakened zone 11. This top wafer 10 is covered by an insulator layer 12. The surface 100 of this insulator layer is to be contacted with a surface 200 of the handle wafer, for a direct bonding. These two surfaces 100, 200 shall be referred to as the respective "front" surfaces of wafers 10 and 20. And the opposite surfaces of these two wafers (respectively surface 110 and surface 210) are referred to as the respective "back" surfaces of these wafers.

FIG. 1b shows the activation of the front surfaces 100 and 200 by a plasma, in a plasma chamber. As illustrated in FIG. 1c, this activation creates an activated region 101 on the front surface 100 of the top wafer 10, and an activated region 201 on the front surface 200 of the handle wafer 20. This activation also generates contaminants due to the exposure of the wafers to a plasma. Such contaminants are more particularly illustrated by references 111 and 211 on the respective back faces 110, 210 of the wafers, as the front faces receive significantly less contaminants than the back faces (as an example, the plasma activation of a silicon wafer typically generates a contaminant concentration of about $2\times10^{10}$ atoms/cm$^2$ on the "front" surface which is to be activated and which faces the inner space of the plasma chamber, the contaminant concentration being above $10^{11}$ atoms/cm$^2$ on the back surface of the wafer). This is due in particular to the fact that the physical contacts between each wafer and the supporting elements (e.g. chucks) associated with the plasma chamber are made on the back surface of the wafer.

In commercially available equipment for microelectronic application, the wafer is disposed on a chuck in the plasma chamber. The chuck is adapted to perform the following functions:

receive and hold the wafer very tightly in place during exposure to the plasma, regulate the wafer temperature during plasma exposure, by temperature diffusion, act as an electrode to transfer polarization (bias voltage) to the wafer.

This set of functions that have to be performed by the chuck leads to selecting materials for making the chuck that contain elements that are likely to contaminate the surface of the wafer in contact with the chuck (i.e. the back surface of the wafer, since it is the front surface which is directly exposed to the plasma). This material can typically be $Al_2O_3$ based sintered ceramics.

FIG. 1d illustrates the direct bonding of top wafer 10 and handle wafer 20, these two wafers being bonded by their front surfaces. This bonding generates a multilayer 30 wafer (also referred to as an "intermediate" multilayer wafer) which comprises in particular the embrittlement or weakened zone 11.

FIG. 1e then illustrates the multilayer wafer 35 obtained after a detachment carried out at the embrittlement zone. This wafer 35 can be a SOI (Silicon On Insulator), SGOI (Silicon-Germanium On Insulator), sSOI (strained Silicon On Insulator), GeOI (Germanium On Insulator), SiCOI (Silicon Carbide On Insulator), SOQ (Silicon On Quartz), or any other type. FIG. 1e also illustrates the remaining part of the top wafer (part 15), which has been detached. This part can be treated and reused for a new process, e.g. for constituting a new top or a new handle wafer.

This type of process illustrates that plasma activation could be advantageous for making multilayer wafers through a DBTP. But plasma activation is in itself associated with another drawback, one that is related to the contaminants generated by the activation. Indeed, as mentioned above plasma activation generates a contamination of the wafer which is exposed to the plasma, in particular on the back surface of the wafer. This "contamination" corresponds to a deposit of metallic elements (e.g. Al, Fe, Ni, Zn, Cr, Ti, Ca, Mg, Y, . . . ) that may be incorporated in fine particles, on the surface of the wafer, or absorbed in the surface in the case of isolated atoms, molecules or ions. This deposit of metallic elements can be observed with levels of contamination in the order of $5\times10^{11}$ to $5\times10^{12}$ atoms/cm$^2$ on at least some areas of the surface of the exposed wafer. Such concentrations are too high for a multilayer wafer which is to be subject to further thermal treatments (e.g. a high temperature: annealing at temperatures above 1000° C. for smoothing the surface of the wafer, or further treatments carried out on the multilayer wafer for integrating 30 components into the wafer). Indeed, the contaminants of a multilayer wafer which would be exposed to such high temperatures treatments would undergo a diffusion in the volume of the wafer, and significantly alter the properties (in particular the electrical properties) of the wafer and of its components. And contaminant concentrations such as those mentioned above and resulting from a plasma activation are thus significantly higher than the specifications of maximum contamination level generally in use in the industry of manufacturing the multilayer wafers and their associated components (these specifications being in the order of $5\times10^{10}$ atoms/cm$^2$, or even less).

Thus, carrying out a direct bonding transfer process (such as e.g. a SMART-CUT®-type process) with an activation of the surfaces to be bonded as in the known state of the art, in order to make multilayer wafers, is associated with some minor drawbacks. And it is specified that if these drawbacks have been exposed hereabove in reference to a plasma activation, similar drawbacks can also be associated to the activation of a surface which is different from a plasma activation (e.g. an oxidation and/or a chemical activation, etc.). Accordingly, the present invention seeks to overcome the previously noted drawbacks and disadvantages.

SUMMARY OF THE INVENTION

The invention relates to a method for minimizing or avoiding contamination of a final multilayer structure obtained by transfer of a thin layer from a donor wafer. This method includes one step of providing a donor wafer and a receiving handle wafer, each having a first surface prepared for bonding and a second surface, with the donor layer including a zone of weakness that defines a thin layer of donor wafer material to be transferred to the receiving handle wafer. Next, at least one of the first surfaces is treated to provide increased bonding energy when the first surfaces are bonded together; the surfaces are then bonded together to form an intermediate multilayer structure; and the thin layer is transferred to the receiving handle wafer to form a final multilayer structure by detachment at the zone of weakness and removal of remaining material of the donor wafer. This method avoids or minimizes wherein contamination of the final multilayer structure is minimized or avoided by treating only the first bonding surface of the donor wafer prior to bonding, or by cleaning contamination from the second surfaces of the intermediate multilayer structure prior to detachment of the thin layer.

The treating step preferably comprises activating that surface by exposure to a plasma, preferably one that generates more than $10^{11}$ atoms/cm$^2$ of metallic contamination of the second surface of the donor wafer, and the method further comprises removing this contamination by cleaning of that second surface. The contamination is preferably cleaned from the second surface of the donor wafer when present in the intermediate multilayer structure prior to detachment of the thin layer.

The treating step may also comprise activating the first surfaces of both the donor and receiving handle wafers by exposure to a plasma, and then cleaning the second surfaces of both the donor and receiving handle wafers. This cleaning step can be conducted when the donor and receiving handle wafers are present in the intermediate multilayer structure by immersion of the intermediate multilayer structure into a cleaning solution.

Alternatively, the treating step can comprise subjecting the first bonding surface of the handle receiving wafer to surface activation prior to bonding followed by cleaning contamination from the second surface of the handle receiving wafer when present in the intermediate multilayer structure prior to detachment of the thin layer, preferably by spraying a cleaning solution upon that second surface.

Also, the treating step can comprise subjecting the first bonding surfaces of both the donor and handle receiving wafers to surface activation prior to bonding followed by cleaning contamination from the second surfaces of the donor and handle receiving wafers when present in the intermediate multilayer structure prior to detachment of the thin layer, preferably by immersing the intermediate multilayer wafer into a cleaning solution immediately after the bonding step. The cleaning solution can be a SC2 solution or a hydrofluoric acid solution.

In advantageous embodiments, at least one first surface comprises an insulating material, and the zone of weakness is made by introducing at least one species into the donor wafer prior to bonding. Preferably, the zone of weakness is made by implanting one or two different species into the donor wafer prior to bonding. Detachment can be carried out by annealing the intermediate multilayer structure at a temperatures of between 200 and 350° C., and the second surface is cleaned utilizing monoface cleaning equipment. Also, the method further comprises subjecting the final multilayer structure to a high temperature thermal treatment at a temperature of greater than 900° C. Preferred materials for the wafers include a donor wafer made of Si, SiGe, SiC or Ge and a receiving handle layer made of Si, fused silica, SiC or glass.

BRIEF DESCRIPTION OF THE DRAWING FIGURES

Other aspects and advantages of the invention shall appear when reading the following description made in reference to the accompanying drawings, in which:

FIGS. 1a-1e which have already been commented on in the background make reference to a SMART-CUT®-type process which is generally known in the art;

FIGS. 2a-2e are a diagrammatical flowchart of a process according to a first embodiment of the invention, and FIGS. 3a-3f are a diagrammatical flowchart of a process according to a second embodiment of the invention.

DETAILED DESCRIPTION OF THE PREFERRED EMBODIMENTS

As noted, the present method is conducted to avoid or minimize contamination of the second surface of the receiving handle wafer. This method includes transferring from a top donor wafer a layer of material onto a receiving handle wafer, the top and receiving wafers comprising respective surfaces to be bonded. The method steps comprise a treatment step for treating at least a surface to be bonded, the treatment of a given surface of a wafer generating on the opposed surface of the wafer a contamination, a bonding step for direct bonding the surfaces to be bonded of the top and handle wafers, in order to form an intermediate multilayer wafer, and a removal step for removing excess material from the top wafer. The method reduces contamination by treating only the first bonding surface of the donor wafer prior to bonding, or by cleaning contamination from the second surface of the handle receiving wafer when present in the intermediate multilayer structure prior to detachment of the thin layer.

Preferred but non-limiting aspects of such a method are the following:

the treatment step is a surface activation step, the contamination of the wafer surface which is opposed to the activated surface corresponds to a metallic contaminants concentration above than $10^{11}$ atoms/cm$^2$, the treatment is carried out through the exposure of the surface(s) to be treated to a plasma, the removal step is carried out by detaching the excess material from the top wafer, the detachment is carried out at an embrittlement zone which has been made by introduction of at least one species in the top wafer, the introduction of species is carried out through an implantation of one or more species, the implantation is a co-implantation of at least two species, the implantation is carried out with a global implantation dose of a few $10^{16}$ atoms/cm$^2$, the removal step is carried out through a splitting annealing carried out at temperatures remaining under 350° C., and preferably between 200° C. and 300° C.

during the treatment step only a surface of the top wafer is treated, the cleaning step is carried out immediately after the bonding step, the cleaning step is carried out before any high temperature thermal treatment, the cleaning step is a wet cleaning, the cleaning step is carried out with a SC2 solution and/or a HF solution, the cleaning step is carried out with a mono face cleaning equipment, the top wafer is made of Si, or SiGe, SiC, or Ge, the handle wafer is made of Si, fused silica, SiC, or glass, the method further comprises a high temperature thermal treatment of the structure which comprises the handle wafer and the part of the top wafer which has not been removed, the high temperature thermal treatment is carried out at a temperature greater than 900° C.

It is specified that the two embodiments which shall be presented hereunder can be combined. It is also specified that on the Figures which shall be commented hereunder, the elements and features which are identical or similar to those commented with reference to FIG. 1 shall be associated to the same reference numeral.

First Embodiment

FIG. 2 (which comprises FIGS. 2a-2e) shows the main steps of a first embodiment of the invention. These steps reproduce some of the steps 1a to 1e are commented above in the description of FIG. 1. FIG. 2a thus shows a top wafer 10 with an implanted embrittlement zone 11, and a handle wafer 20. At this stage the front surfaces 100 and 200 of top wafer 10 and handle wafer 20 can undergo preliminary treatments for preparing the surfaces to be bonded. These preliminary treatments can include a Chemical-Mechanical Polishing (CMP) and/or one or more cleanings with a cleaning solution (such as RCA, SPM+RCA, etc.). The top wafer 10 can be made of Si, SiGe, Ge, SiC, or in any other semiconductor material. The handle wafer 20 can be made of Si, fused silica, SiC, glass (all these materials being possibly in crystalline, polycrystalline or amorphous form), or in any other semiconductor material.

The embrittlement zone 11 can have been made by introduction of species in the top wafer (this "introduction being carried out e.g. as an implantation and/or by diffusion, or by any other known technique). In the case where the "introduction" of species is an implantation of species, such implantation can be an implantation of only one species (such as e.g. H or He). It can also have been made by implantation of several species (i.e. co-implantation), for example H and He. Here again, the front surface 100 of the top wafer is the surface of an oxide layer (e.g. a deposit of SiO2, or an oxidized region of the underlying material).

Figure 2B:
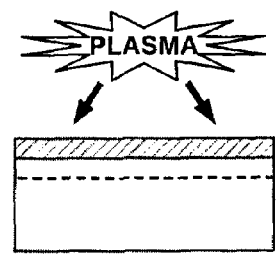
Figure 2B:
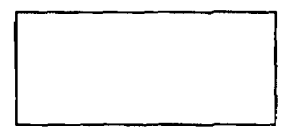
Figure 2C:
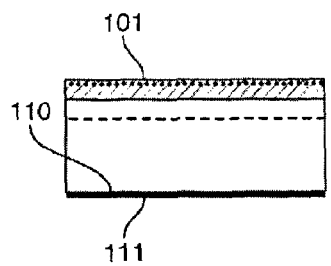

FIG. 2b illustrates an activation step, during which the front surface 100 of the top is exposed to a plasma. This activation step—like all activation steps mentioned in the different embodiments described in this text—more generally corresponds to a treatment step of a surface to be bonded, with a generation of a contamination on the surface of the wafer which is opposite to the surface treated. The back surface 110 of top 10 is therefore covered by a region 111 which is contaminated with metallic contaminants such as those mentioned above (see FIG. 2c). And as mentioned above, this contamination on the back surface of the top wafer corresponds to contaminant concentrations which is typically higher than the maximum concentration generally tolerated.

It shall be noted that during this activation step, only the top wafer is exposed to a plasma in order to be activated. The handle wafer 20 is not exposed to any plasma. Therefore, no contamination is deposited on the surfaces of the handle wafer. This selective exposure of the donor top wafer only is specific to this first embodiment of the invention.

In the known experiments for using a plasma activation in a DBTP, both front surfaces of the top and of the handle wafers were exposed for activation by a plasma. In such experiments, the drawbacks associated to the contamination of a multilayer structure which could undergo further high temperature treatments had not been pointed out.

It is to be noted that a reports on one of such experiments (see the article entitled "Ultra-thin strained-silicon-on-insulator and SiGe-on-insulator created using low-temperature wafer bonding and metastable layers", Taraschi et W., J. Electrochem. Soc. Vol. 151, No 1, p. 47 (2004)) mentions the plasma activation of only one of the wafers to be bonded. But this mention makes reference to the activation of the handle wafer, and not of the top wafer. And not surprisingly, there is no mention in this article of any problem associated to the contamination resulting from the plasma activation.

Figure 2D:
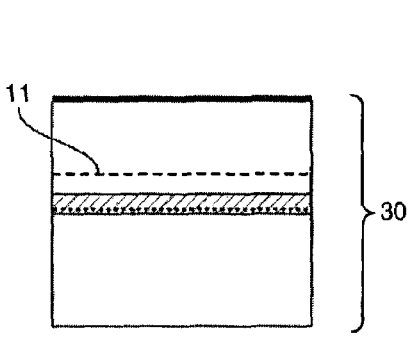

The following step is the direct bonding of the top wafer and the handle wafer, for making an intermediate multilayer wafer 30 (FIG. 2d). The excess material from the top is then removed. In the illustration of this first embodiment presented on FIGS. 2a-2e, this removal is carried out by detaching the excess material as delimited in the top of 10 by the embrittlement zone 11. In this particular case which refers to a SMART-CUT®-type method, the remainder 15 of the top is detached from the intermediate wafer 30.

The removal can also be carried out according to any method known for BTPs. This removal can therefore be carried out by etching the back face of the top wafer 10 (i.e., the face of the top wafer which is opposed to the front surface 100), on the intermediate wafer 30. In such case (which corresponds to a BESOI-type method), it is not necessary that any implantation has been carried out on the top wafer.

The removal step can also be performed in accordance with the ELTRAN® method. In such case, the embrittlement zone has previously been made by porous material, and here again no implantation is necessary.

In the case of a SMART-CUT®-type or ELTRAN®-type method, a remainder 15 shall be obtained. In every case (i.e. whatever the method used for removing the excess material of the top), the multilayer wafer 35 obtained does not comprise a heavy contamination generated on a back surface of a wafer whose front surface would have been exposed to a plasma for its activation. Indeed, in all cases the heavy contamination region 111 which is on the back surface of the top wafer has been removed from the multilayer wafer 35. This is particularly advantageous since this multilayer wafer shall then undergo additional thermal treatments, some of these thermal treatments being as mentioned before carried out at high temperatures (e.g. smoothing annealing at temperatures above 1000° C.). And exposing a wafer comprising heavy concentrations of contaminants (e.g. concentrations above $10^{11}$ atoms/cm$^2$) would generate an unacceptable and irreversible diffusion of the contaminants into the wafer.

In the case of a method generating a remainder 15, the only heavy ion contamination (region 111) is on the remainder, the multilayer wafer 35 being totally free of such heavy contamination. Therefore, this first embodiment of the invention allows to make a multilayer wafer with a DBTP, without having the multilayer wafer polluted by a heavy concentration of contaminants. It is specified that the contaminant concentrations which can be observed on the front face of the exposed top after the activation step are in the order of $2 \times 10^{10}$ atoms/cm$^2$, which is a generally acceptable concentration level.

Figure 2E:
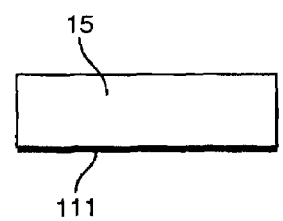
Figure 2E:
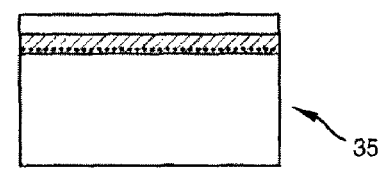

The removal step illustrated in FIG. 2e is carried out by detaching the top wafer at the implanted embrittlement zone 11. This detachment can result from a mechanical and/or thermal action. In the case of a thermal action (i.e. a splitting annealing), the temperature should be kept at moderate values, in order to avoid any diffusion of contaminants which would have been generated on the front surfaces 100, 200 (and would therefore be located in the vicinity of the bonding interface). Typical values of moderated temperatures for such splitting annealing are 300-500° C., for a multilayer wafer such as an SOI and always in the specific case of the use of a SMART-CUT®-type method as illustrated in FIGS. 1a-1e, the implantation of the top for creating the embrittlement zone 11 can advantageously be made with more than one species (co-implantation, e.g. of H and He). Indeed, such co-implantation allows a reduction of the temperature for the splitting annealing. The splitting at an embrittlement zone created by co-implantation (e.g. H+He into a Si top wafer) occurs (for a given global implantation dose—i.e. the sum of the doses of all implanted species which can typically be a "standard" implantation dose of e.g. $5 \times 10^{16}$ atoms/cm$^2$ and more generally a few $10^{16}$ atoms/cm$^2$) at lower temperatures than it would have occurred in the same top wafer implanted with the same global implantation dose, but with only one species. For more details on the conditions of such a co-implantation which allows a reduction of the temperature for the splitting annealing, with a "standard" global dose, reference is made to WO/042779.

A co-implantation (e.g. with H+He) therefore constitutes a favorable feature for performing a splitting annealing at moderated temperatures as mentioned above. And such co-implantation even allows a further reduction of the temperature for the splitting annealing. For a H+He co-implantation in a Si top wafer with a global implantation dose of a few $10^{16}$ atoms/cm$^2$, this temperature can remain under 350° C. and in particular can be in a range as low as 200-300° C.

Second Embodiment

FIG. 3 (which comprises FIGS. 3a-3f) shows the main steps of a second embodiment of the invention. FIG. 3a illustrates—as FIGS. 1a and 2a—a top wafer 10 and a handle wafer 20. The materials of the top and the handle wafers can be the identical to the materials mentioned in reference to the first embodiment described above. Here again, the top wafer has been implanted with one or more 30 species for generating an embrittlement zone 11. But here again, such implanted embrittlement zone is only a particular illustration corresponding to the case where the invention is embodied with a SMART-CUT®-type method, whereas any type of DBTP can be used. And more generally, unless otherwise specified, all information given above for the first embodiment is applicable to this second embodiment.

Figure 3A:
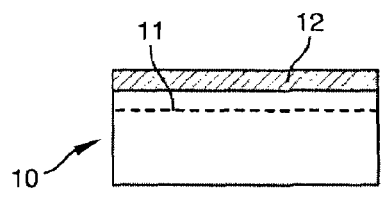
Figure 3A:
Figure 3B:
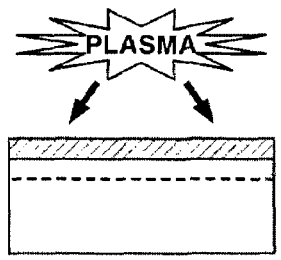
Figure 3B:
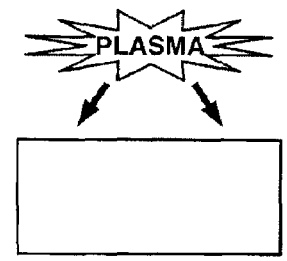

FIG. 3b illustrates the step of activation through exposure to a plasma. During this step, the front surface of the top wafer 10 and/or of the handle wafer 20 can be exposed. If only the top wafer 10 is exposed to a plasma for activation, the first embodiment described above can be combined with the second embodiment.

Figure 3C:
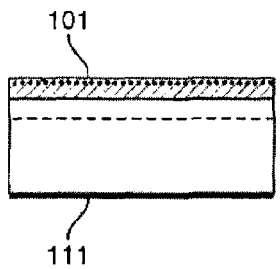
Figure 3C:
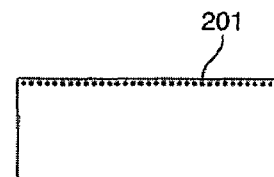
Figure 3D:
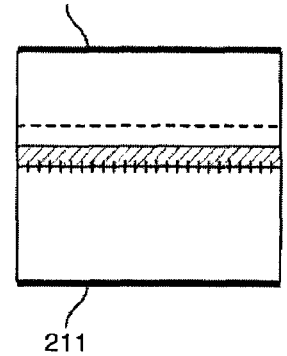
Figure 3E:
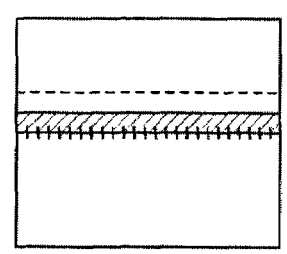

FIGS. 3b-3d illustrate the particular case where both top and handle wafers are activated by a plasma. FIG. 3c thus illustrates highly contaminated regions 111 and 211 respectively associated to the back surfaces of the top and the handle wafers. Of course, if only the top wafer is activated there would be only a region 111 and if only the handle wafer is activated there would be only a region 211.

FIG. 3d illustrates the direct bonding of the top and handle wafers, with their front surfaces contacted. In this second embodiment, the bonding is followed (preferably immediately followed) by a cleaning step (FIG. 3e) for removing the contaminants from the highly contaminated regions 111 and 211 on the intermediate multilayer wafer 30 (or from the region 111 or 211 which has been formed, if only one such highly contaminated region has been formed because only one wafer was activated by a plasma before bonding). The region 111 is the to be associated to a first "main" surface of the intermediate multilayer wafer 30, and the region 211 is the to be associated to a second "main" surface of the intermediate multilayer wafer. This cleaning step is carried out on the intermediate multilayer wafer 30 which has been made by the direct bonding of the top and handle wafers, with a cleaning solution able to eliminate contaminants. A SC2 solution or a HF solution can be used for that purpose.

The cleaning step is carried out before the wafer undergoes any high temperature treatment (i.e. any thermal treatment above 900° C.). The cleaning step illustrated in FIG. 3e can be composed of several successive cleaning steps. Such cleanings are carried out on the intermediate multilayer wafer 30. This differs from the cleaning operations known in the art since these cleaning are usually carried out on single-layer wafers such as bulk silicon wafers.

Each cleaning of the cleaning step can be carried out as a wet cleaning, i.e. by immersing the wafer to be cleaned in a bath made of the cleaning solution. It is however also possible to perform such cleaning with a monoface cleaning equipment, which projects a controlled spray or jet of cleaning solution selectively, only on the surface to be cleaned. Concerning the cleaning step it is to be noted that the method of the invention is contrary to what one might have expected, in that the use of a cleaning solution on a multilayer wafer 30 whose layers have already been bonded together produces very satisfactory results. Indeed, the prior art tends to indicate that such cleaning should be avoided because the cleaning solution might be infiltrated at the bonding interface (see e.g. "Semiconductor on Wafer Bonding: Science and Technology'—Tong and Gosele, sponsored by the Electrochemical Society, Inc., a Wiley-Interscience Publication, 1999). Such infiltrations would be associated to risks of degrading the quality of the bonding, or even undo the bond between the bonded wafers.

In addition, when considering the prior art one would consider that the manipulations associated to a cleaning step would favor debonding of the bonded wafers. Moreover, one would also consider that the cleaning step would most probably lower the bonding energy at the edge of the bonding interface of the bonded wafer. Therefore, a cleaning step carried out as in this second embodiment goes against the teachings of the prior art.

And the specific process provided by this second embodiment, which has the cleaning performed after the bonding, further allows the inventive process to use a solution such as a SC2 or HF solution, which is known to efficiently remove metallic contaminants. A SC2 or HF solution would indeed have been associated with problems if used for cleaning the top and/or handle wafer before bonding them together: in such case, the SC2 or HF solution would have removed the undesirable contaminants, but would also have deactivated the surfaces to be bonded—thus losing the benefit of the plasma activation. It therefore appears that the specific method proposed in this second embodiment also corresponds to an advantageous process which allows the manufacturing of a multilayer wafer through a DBTP, with a LT BHT.

Figure 3F:
Figure 3F:
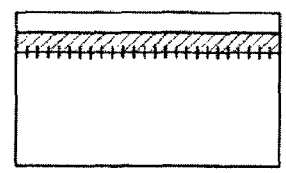

FIG. 3f illustrates the removal step of the excess material of the top wafer. Here again, all comments made above about the first embodiment are applicable to this embodiment as well. An advantage of this second embodiment is that in the case of a removal carried out in a way which generates a remainder (as illustrated in the left part of FIG. 3f), this remainder has already been cleaned by the cleaning step. It is specified that if the description given above of embodiments of the invention is focused on the case of an activation (or several activations) carried out through the exposure to a plasma ("plasma activation"), such activation can alternatively be carried out under different forms (e.g. oxidation and/or chemical activation, etc.).

In all cases the activation is intended to enhance the bonding energy associated to a bonding of the surface which is activated (the surface can generally be referred to as a "front" surface), associated to the generation of a heavy contamination on the "back" surface which is opposed to the "front" surface to be activated (with a "heavy" contamination being understood as corresponding to a contaminant concentration above $10^{11}$ atoms/cm$^2$).

And in all embodiments the invention ensures that no wafer surfaces can undergo high temperature thermal treatments if the surface is heavily contaminated.

What is claimed is:

1. A method for minimizing or avoiding contamination of a semiconductor structure obtained by bonding of donor wafer to a receiving handle wafer, which comprises:
   providing a donor wafer and a receiving handle wafer, each having a first surface for bonding and a second surface;
   treating only the first surface of the donor wafer by exposure to a plasma prior to bonding to provide increased bonding energy when the first surfaces are bonded together;
   bonding the first surfaces together to form an intermediate structure; and
   removing of a portion of the donor wafer from the intermediate structure, thus leaving a transfer layer bonded to the receiving handle wafer;
   wherein any thermal treatment of the intermediate structure conducted after exposure to a plasma is limited to a temperature of 200° C. to 500° C. in order to avoid diffusion of impurities into the transfer layer.

2. The method of claim 1, wherein the donor wafer is made of Si, SiGe, SiC or Ge.

3. The method of claim 1, wherein the receiving handle wafer is made of Si, fused silica, SiC or glass.

4. The method of claim 1, wherein at least one first surface comprises an insulating material.

5. The method of claim 1, wherein the donor wafer further comprises a zone of weakness to assist in removing the donor wafer portion.

6. The method of claim 5, wherein the zone of weakness made by implanting at least one species into the donor wafer prior to bonding.

7. The method of claim 5, wherein the zone of weakness is made by implanting one or two different species into the donor wafer prior to bonding.

8. The method of claim 5, wherein the removal of the donor wafer portion is carried out by annealing the intermediate structure at a temperature of between 200 and 350° C. to detach the transfer layer at the zone of weakness.

9. A method for minimizing or avoiding contamination of a semiconductor structure obtained by transfer of a thin layer from a donor wafer, which comprises:
   providing a donor wafer and a receiving handle wafer, each having a first surface prepared for bonding and a second surface, with the donor wafer providing a layer of material to be transferred to the receiving handle wafer;
   treating at least one of the first surfaces to provide increased bonding energy when the first surfaces are bonded together;
   bonding the first surfaces together to form an intermediate structure;
   removing a portion of the donor wafer to transfer the thin layer to the receiving handle wafer and form the semiconductor structure; and
   avoiding or minimizing contamination of the semiconductor structure by treating only the first surface of the donor wafer by exposure to a plasma prior to bonding and cleaning the contamination from the second surface of donor wafer after bonding but prior to removal of the donor wafer portion, or by treating both first surfaces by exposure to a plasma followed by cleaning contamination from the second surface of the receiving handle wafer after bonding but prior to removal of the donor wafer portion, or by treating the first surface of the receiving handle wafer by exposure to a plasma followed by cleaning the second surface of the receiving handle wafer after bonding but prior to removal of the donor wafer portion.

10. The method of claim 9, wherein at least one first surface comprises an insulating material.

11. The method of claim 9, wherein the donor wafer is made of Si, SiGe, SiC or Ge.

12. The method of claim 9, wherein the receiving handle wafer is made of Si, fused silica, SiC or glass.

13. The method of claim, wherein the intermediate structure is a multilayer structure.

14. The method of claim 1 wherein the plasma treatment of the first surface of the donor wafer generates more than $10^{11}$ atoms/cm$^2$ of impurities on the second surface of the donor wafer.

15. The method of claim 1 which further comprises introducing the donor wafer into a plasma chamber prior to the plasma treatment, with the second surface of the donor wafer being in physical contact with a supporting element.

16. The method of claim 1 which further comprises conducting a high temperature annealing of the transfer layer bonded to the receiving handle wafer after the removing of the portion of the donor wafer from the intermediate structure.

* * * * *